United States Patent
Beaudoin et al.

(10) Patent No.: US 12,204,443 B2
(45) Date of Patent: *Jan. 21, 2025

(54) METHOD AND SYSTEM FOR IN-LINE ECC PROTECTION

(71) Applicant: TEXAS INSTRUMENTS INCORPORATED, Dallas, TX (US)

(72) Inventors: Denis Roland Beaudoin, Rowlett, TX (US); Ritesh Dhirajlal Sojitra, Murphy, TX (US); Samuel Paul Visalli, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/449,025

(22) Filed: Aug. 14, 2023

(65) Prior Publication Data

US 2023/0393975 A1 Dec. 7, 2023

Related U.S. Application Data

(63) Continuation of application No. 17/474,141, filed on Sep. 14, 2021, now Pat. No. 11,726,907, which is a continuation of application No. 16/590,515, filed on Oct. 2, 2019, now Pat. No. 11,119,909.

(60) Provisional application No. 62/777,993, filed on Dec. 11, 2018.

(51) Int. Cl.
*G06F 12/02* (2006.01)
*G06F 12/0879* (2016.01)
(Continued)

(52) U.S. Cl.
CPC ...... *G06F 12/0246* (2013.01); *G06F 12/0292* (2013.01); *G06F 12/0879* (2013.01);
(Continued)

(58) Field of Classification Search
CPC ............ G06F 12/0248; G06F 12/0292; G06F 12/0879; G06F 13/4027; G11C 29/76; G11C 29/42; G11C 11/409
See application file for complete search history.

(56) References Cited

U.S. PATENT DOCUMENTS 6,804,799 B2 10/2004 Zuraski, Jr.
7,043,679 B1 5/2006 Keltcher et al.
(Continued)

FOREIGN PATENT DOCUMENTS

CN 104464823 A 3/2015
EP 0415547 A2 3/1991

OTHER PUBLICATIONS

Chinese Office Action for 201980068709.6 mailed Jan. 9, 2024.
(Continued)

*Primary Examiner* — Samir W Rizk
(74) *Attorney, Agent, or Firm* — Brian D. Graham; Frank D. Cimino

(57) ABSTRACT

A memory system having an interconnect configured to receive commands from a system to read data from and/or write data to a memory device. The memory system also has a bridge configured to receive the commands from the interconnect, to manage ECC data and to perform address translation between system addresses and physical memory device addresses by calculating a first ECC memory address for a first ECC data block that is after and adjacent to a first data block having a first data address, calculating a second ECC memory address that is after and adjacent to the first ECC block, and calculating a second data address that is after and adjacent to the second ECC block. The bridge may also check and calculate ECC data for a complete burst of data, and/or cache ECC data for a complete burst of data that includes read and/or write data.

20 Claims, 3 Drawing Sheets

(51) Int. Cl.
  *G06F 13/40*   (2006.01)
  *G11C 11/409*  (2006.01)
  *G11C 29/00*   (2006.01)
  *G11C 29/42*   (2006.01)

(52) U.S. Cl.
  CPC ........ *G06F 13/4027* (2013.01); *G11C 11/409* (2013.01); *G11C 29/42* (2013.01); *G11C 29/76* (2013.01)

(56) References Cited

U.S. PATENT DOCUMENTS

| | | |
|---|---|---|
| 8,539,313 B2 | 9/2013 | D'Abreu et al. |
| 9,417,821 B2 | 8/2016 | Slaight et al. |
| 11,119,909 B2* | 9/2021 | Beaudoin ............ G06F 12/0879 |
| 11,726,907 B2* | 8/2023 | Beaudoin ................ G11C 8/06 |
| | | 714/763 |
| 2007/0061503 A1 | 3/2007 | Chiang et al. |
| 2007/0079217 A1 | 4/2007 | Haugan et al. |
| 2008/0235485 A1 | 9/2008 | Haertel et al. |
| 2013/0080853 A1 | 3/2013 | D'Abreu et al. |
| 2021/0406171 A1* | 12/2021 | Beaudoin ............ G06F 12/0879 |

OTHER PUBLICATIONS

Extended European Search report for EP 19895886.0 mailed May 24, 2022.
International Search Report for PCT/US2019/065416 mailed Mar. 26, 2020.
Partial Supplementary European Search Report for EU 19895886.0; mailed Dec. 21, 2021.

* cited by examiner

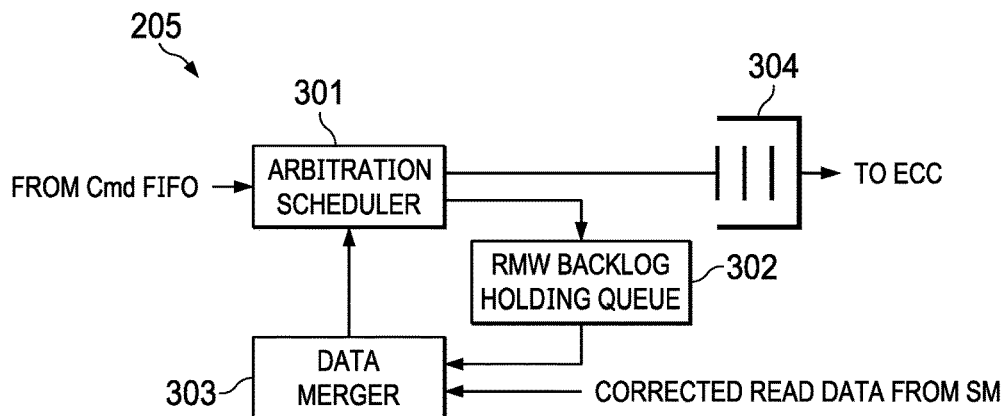
FIG. 3
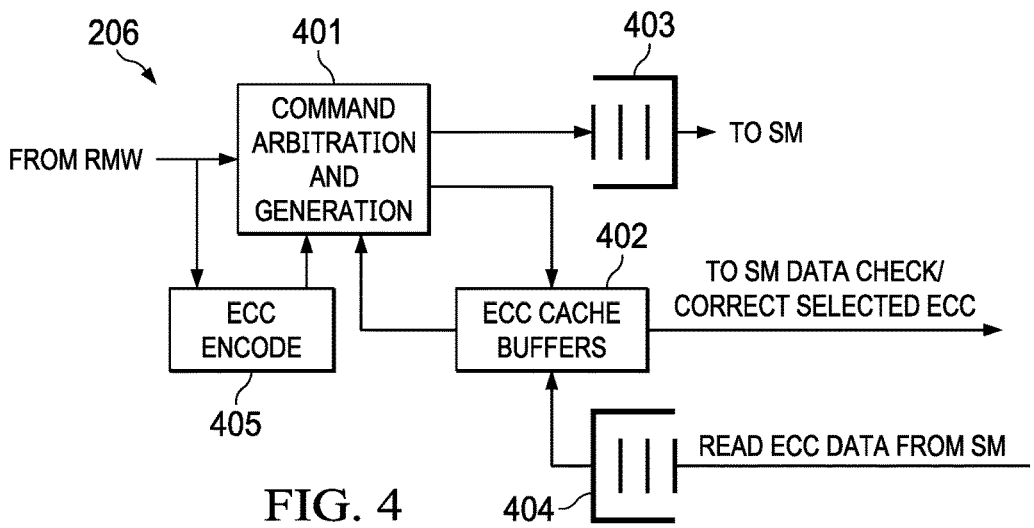
FIG. 4
FIG. 5

# METHOD AND SYSTEM FOR IN-LINE ECC PROTECTION

CROSS-REFERENCE TO RELATED APPLICATIONS

This application is a continuation of U.S. patent application Ser. No. 17/474,141, filed Sep. 14, 2021, which is a continuation of U.S. patent application Ser. No. 16/590,515, filed Oct. 2, 2019, now U.S. Pat. No. 11,119,909, which claims priority to U.S. Provisional Application No. 62/777,993, filed Dec. 11, 2018, each of which is incorporated by reference herein in its entirety.

BACKGROUND

In a computing system, data stored in memory (e.g., dynamic random-access memory (DRAM) or Double Data Rate (DDR) Synchronous Dynamic Random Access Memory (SDRAM)) may be subject to errors in the controller, physical interface (PHY) or board during a write or a read operation, or in the memory array itself while data is stored there. In addition, external memory is often made by a third party and/or may not be rated for functional safety applications or be sufficiently reliable for the application. Incorrect data or instructions from memory may cause a system to operate incorrectly. Incorrect operation of a system is not desirable, particularly in system or application where functional safety or reliability is critical.

There are generally three types of memory errors: permanent, transient and systematic. A permanent error is typically the result of physical damage or degradation to the memory or associated circuitry, or may be a short in silicon or in a wire. A transient error may be due to particle strikes and generally results in a bit flipping states (e.g., in a flip flop). A systematic error is a bug in the logic, for example, the system works correctly as designed, there is just a bug in the hardware or software.

SUMMARY

Examples described herein include an integrated circuit that includes an interconnect configured to receive from a system commands to read data from and/or write data to physical addresses of a memory device. The integrated circuit further includes a bridge configured to receive the commands from the interconnect and to perform address translation between system addresses and the physical addresses by calculating a first ECC memory address for a first ECC data block that is after and adjacent to a first data block having a first data address, calculating a second ECC memory address that is after and adjacent to the first ECC block, and calculating a second data address that is after and adjacent to the second ECC block.

Another exemplary integrated circuit described herein includes an interconnect configured to receive from a system commands for reading and/or writing a portion of data. The integrated circuit further includes a bridge configured to receive the commands from the interconnect and to check and calculate ECC data for a burst of data that includes the portion of data.

Another exemplary integrated circuit described herein includes an interconnect configured to receive from a system a command for reading and/or writing a portion of data. The integrated circuit further includes a bridge configured to receive the command from the interconnect and to check and calculate ECC data, the bridge further configured to cache ECC data for a complete burst of data that includes the portion of data.

Examples described herein also include a memory system having a memory device, a processor and an interconnect configured to receive from the processor commands to read data from and/or write data to physical addresses of the memory device. The memory device further includes a bridge configured to receive the commands from the interconnect and to perform address translation between system addresses and the physical addresses by calculating a first ECC memory address for a first ECC data block that is after and adjacent to a first data block having a first data address, calculating a second ECC memory address that is after and adjacent to the first ECC block, and calculating a second data address that is after and adjacent to the second ECC block.

Another exemplary memory device described herein includes a memory system having a memory device, a processor and an interconnect configured to receive from the processor a command for reading and/or writing a portion of data to the memory device; and a bridge configured to receive the command from the interconnect and to check and calculate ECC data, the bridge further configured to cache ECC data for a complete burst of data that includes the portion of data.

Examples described herein also include a method of writing data to or reading data from an external memory. The method includes receiving from a system a command for reading and/or writing a portion of data and caching ECC data for a complete burst of data that includes the portion of data.

Also described herein is an exemplary method of writing data to or reading data from an external memory. The method includes receiving from a system a command for reading and/or writing a portion of data and checking ECC data for a complete burst of data that includes the portion of data.

Also described herein is an exemplary method of translating system memory addresses to physical memory addresses. The method includes providing a first ECC block associated with a first data block and providing a second ECC block associated with a second data block. The method further includes calculating a first ECC memory address for the first ECC data block that is after and adjacent to the first data block having a first data address, calculating a second ECC memory address that is after and adjacent to the first ECC block, and calculating a second data address for the second data block that is after and adjacent to the second ECC block.

BRIEF DESCRIPTION OF THE DRAWINGS

For a detailed description of various examples, reference will now be made to the accompanying drawings in which:

FIG. 3 illustrates a block diagram of an exemplary read-modify-write block.

FIG. 4 illustrates a block diagram of an exemplary in-line ECC block.

FIG. 5 illustrates an exemplary addressing pattern.

DETAILED DESCRIPTION

The recitation "based on" means "based at least in part on." Therefore, if X is based on Y, X may be a function of Y and any number of other factors.

Examples described herein calculate a Single-Error-Correct-Double-Error-Detect (SECDED) ECC across each word of a burst. The size of a burst depends on the requirements of the memory device, and is generally a power of two (e.g., 16, 32, 64, 128, 256). The ECC syndrome(s) are stored intermixed with the normal data ('in-line') such that no burst of data or ECC data extends over a page boundary. Generally, storage and retrieval consists of two distinct commands: one for the data and a second for the ECC syndrome. Address calculation for the data and the ECC syndrome may be done automatically so the host system still sees a flat, contiguous memory map. The address calculation may use a rolling system that ensures that a permanent fault on a single address will not be masked by missing entire chunks of data/ECC.

Embodiments of the invention also calculate and check the ECC across an entire burst, regardless of how much data is written or read, to further ensure that there are no issues with the bursts or the aliasing of the ECC syndrome providing a false match. Exemplary systems described herein automatically perform read-modify-write (RMW) operations when less than a full ECC quanta of data is written while maintaining full data coherence. Exemplary systems described herein also implement an ECC cache where writes and reads are stored and merged in order to reduce RMW operations that would otherwise be incurred when receiving sub-burst writes and multiple reads that would be required when requesting sub-burst reads.

Figure 1:
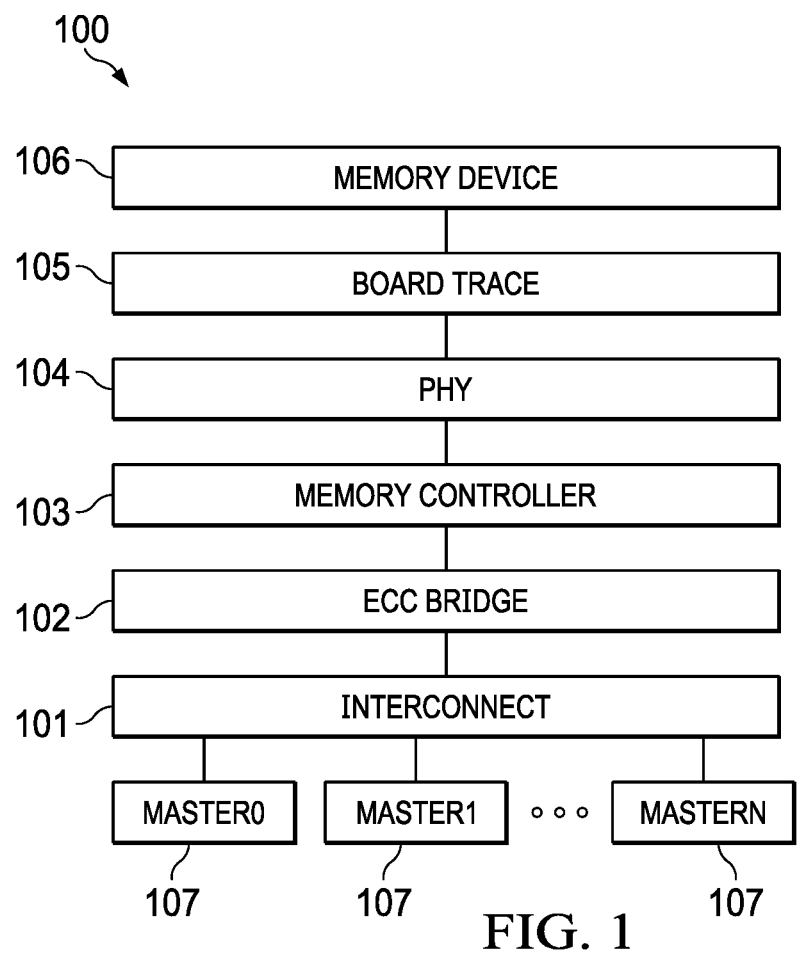
FIG. 1 illustrates a block diagram of an exemplary memory system.

FIG. 1 shows a memory system 100 according to an example described herein. Memory system 100 includes interconnect 101, which provides an interface for masters 107 to read from and write to memory. Masters 107 may include, for example, a processor. Interconnect 101 performs any necessary translation and sends the calls from the masters 107 to the ECC bridge 102. The ECC bridge 102 serves as the interface between a computing system and the memory device. The ECC bridge 102 may handle, for example, error-correcting code (ECC) checking, address conversion between system addresses and physical address and voltage conversion between the computing system domain and the memory device domain (beginning with memory controller 103). The memory domain includes a memory controller 103, physical layer (PHY) 104, board trace 105 and the memory device 106 itself. Memory controller 103, physical layer (PHY) 104, board trace 105 and memory device 106 may be, for example, SDRAM and can be external or internal RAM.

Figure 2:
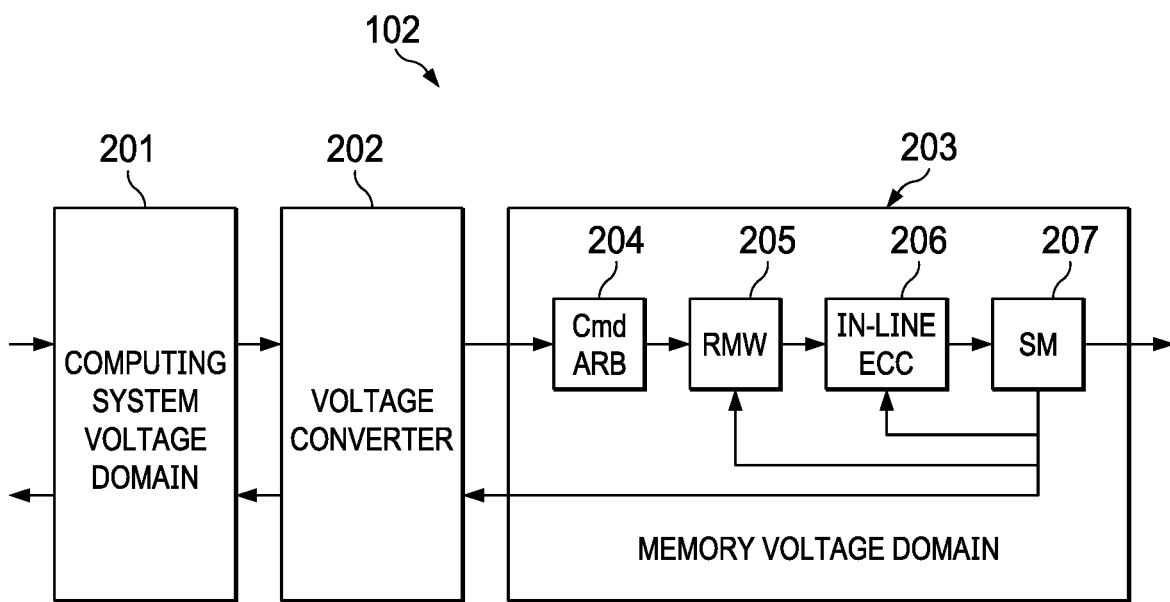
FIG. 2 illustrates a block diagram of an exemplary ECC bridge.

FIG. 2 shows a block diagram of ECC bridge 102. ECC bridge 102 interfaces with interconnect 101, which operates on the computing system voltage, using computing system voltage domain 201. ECC bridge 102 also includes memory voltage domain 203 for interfacing with the memory device 106, which operates on a memory voltage (e.g., DDR voltage). ECC bridge 102 also includes voltage converter 202 for performing voltage conversion between the computing system voltage domain 201 and the memory voltage domain 203.

Memory voltage domain 203 includes command arbiter 204, which receives the voltage-converted read or write command (and accompanying data) from the voltage converter 202 and queues the received commands. The read-modify-write (RMW) block 205 handles read-modify-write operations, e.g., read commands for incomplete ECC quanta write commands. ECC quanta is the size of the data per ECC syndrome (e.g., 8 bytes of data). The in-line ECC block 206 performs three primary functions: adding/calculating ECC, caching ECC data and translating system addresses to physical addresses in the memory device.

The RMW block 205 is shown in more detail in FIG. 3. Commands and data from the command arbiter 204 are received by the arbitration scheduler 301. The arbitration scheduler 301 acts an intake for the RMW block 205, routing incoming commands and performing additional necessary tasks. The arbitration scheduler 301 may forward any command to the in-line ECC block 206 that does not require additional processing by the RMW block 205 (as described below) and/or is not an address collision (Coherent) to any command in the RMW backlog holding queue 302, which may be a first-in-first-out (FIFO) queue. For example, the arbitration scheduler 301 may forward a write command to the in-line ECC block 206 where any of the following conditions are met: (1) all write data byte enables are set for an ECC quanta, (2) the system address is not in an ECC-protected region or (3) the data is not coherent to any command in the RMW backlog holding queue 302. The arbitration scheduler 301 may forward a read command to the in-line ECC block 206 if the data is not coherent to any command in the RMW backlog holding queue 302. Commands forwarded by the arbitration scheduler 301 to the in-line ECC block 206 may be forwarded through multi-threaded FIFO queue 304.

For commands to write a partial ECC quanta of data, the arbitration scheduler 301 issues a read command for a full burst of data and places the write command into the RMW backlog holding queue 302. When the read data is returned from the state machine (SM) 207, it is placed in data merger block 303, where it is merged with the partial-quanta write data that was placed in the RMW backlog holding queue 302. The data merger block 303 routes the merged data to the arbitration scheduler 301, which then issues a write command for the merged data burst that is routed to in-line ECC 206.

The arbitration scheduler 301 also processes commands in the RMW backlog holding queue 302 that, due to a change in circumstances, are no longer coherent. In this case, the data may require merger as described above, or the command may simply be passed to in-line ECC 206. As described above, RMW backlog holding queue 302 holds commands and data that are either waiting on coherency resolution or waiting on return data due to partial writes.

The In-Line ECC block 206 is shown in more detail in FIG. 4. Commands and data sent to the in-line ECC block 206 are received by the command arbitration and generation block 401 and the ECC encode block 405. ECC encode block 405 calculates the ECC for the quanta of data to be written in a write command. ECC encode block 405 may also optionally encode an address of the data into each ECC. The encoded address can be the address of ECC quanta, the burst or the block, and can be a system or virtual address or can be a physical address in the memory device. More than one of these addresses may be encoded into each ECC syndrome.

For an inbound command, command arbitration and generation block 401 generates a sequence of commands based on ECC region and ownership information. For example, certain cache entries may be "owned" by a particular CPU, and only available for use by the CPU. A small set of ECC cache lines in the ECC cache buffers 402 may be reserved for all other system initiators.

When a read command is received by the command arbitration and generation block 401, the command arbitration and generation block 401 determines if the ECC for the associated data is already in the ECC cache buffers 402. If the ECC is in ECC cache buffers 402, the command arbitration and generation block 401 will route the read command to the SM 207 and use the cached ECC. If the ECC for the associated data is not in the ECC cache buffers 402, but the ECC cache buffers 402 have space to cache an ECC block, command arbitration and generation block 401 will route read commands to SM 207 for both the data and ECC block. When the SM 207 returns the ECC blocks, they will be stored in the ECC cache buffers 402 (optionally via multi-threaded FIFO queue 404). If the ECC for the associated data is not in the ECC cache buffers 402 and there is no available space for an additional ECC block, the ECC cache buffers 402 will remove the oldest read ECC data before sending read commands to SM 207 for both the data and ECC block. If the removed ECC data is "dirty," meaning that the cached ECC data is different from the ECC data stored in physical memory, the ECC block may be written to an external memory.

When a write command is received by the command arbitration and generation block 401, the command arbitration and generation block 401 determines if the ECC for the associated data is already in the ECC cache buffers 402. If the ECC is in ECC cache buffers 402, the ECC will be merged into the cached ECC in the ECC cache buffers 402 and will be marked "dirty." If the ECC for the associated data is not in the ECC cache buffers 402, but the ECC cache buffers 402 have space to cache an ECC block, the oldest owned entry in the ECC cache buffers 402 will be allocated and the ECC will be stored in that space and marked "dirty." Command arbitration and generation block 401 will issue a write command to SM 207 for the data block.

If the ECC for the associated data is not in the ECC cache buffers 402 and no space in the ECC cache buffers are owned, command arbitration and generation block 401 will issue a write command to SM 207 for the data block. If the ECC for the associated data is not in the ECC cache buffers 402 and all owned entries are dirty, the oldest entry in the ECC cache buffers 402 will be removed and, if dirty, written to the external memory. That space will be reallocated, and the ECC for the write command will be written to that reallocated space in the ECC cache buffers 402.

Commands sent by the command arbitration and generation block 401 to SM 207 may be sent through multi-threaded FIFO queue 403.

In the exemplary in-line ECC block 206 of FIG. 4, ECC cache buffers 402 hold previously read and written ECC blocks for future use. ECC cache buffers 402 have "dirty" flags for each byte of ECC data, which indicates whether the cached ECC byte is different from the ECC byte stored in physical memory. In the example described herein, each entry in the ECC cache buffer holds ECC syndrome data for eight bursts of data. In this case, the ECC cache buffer holds 64-bytes of ECC syndrome data for eight consecutive blocks of data (512 bytes).

As described above, the in-line ECC block 206 also performs address translation between system addresses and physical memory addresses. Command arbitration and generation block 401 performs this address translation, and inserts the translated address into the read and write commands issued to SM 207. In an example described herein, a system address is translated such that two 64-byte ECC blocks are placed between two 512-byte data blocks (each having eight 64-byte memory bursts). An example of this address translation is shown in FIG. 5. As can be seen in FIG. 5, ECC blocks 52 and 53 are arranged contiguously between 512-byte data blocks 51 and 54.

This address translation provides protection against faults in commands or addressing by staggering all address bits across the data and ECC syndrome storage. This staggered pattern provides efficient use of memory space, preserving ⅛ths of the space for normal data use while only taking ⅛th for ECC syndromes, with little, if any, memory space wasted. In addition, because every 8 bursts (e.g., 512 bytes) of data share a single block used for ECC, an address bit error may never hit an aligned ECC block, protecting the memory address as well as data. In particular, by using a power of two for the burst count (e.g., eight in this example) and a power of three for the burst count plus the ECC Syndrome (e.g., burst count (8)+one=nine in this example), any address bit failure would prevent the data and ECC from being aligned, resulting in an error. In addition, two 64-byte ECC blocks are arranged contiguously so that burst alignment would not cross any 128-byte page boundary. Such an arrangement may support, for example, 128-byte bursts, allowing 128-bytes to begin on a 128-byte memory-aligned boundary. Different numbers and sizes of ECC blocks and data burst/blocks can be used, depending on the burst alignment configuration of the memory device and such that the number of data blocks plus ECC blocks has a prime number bias.

Figure 6:
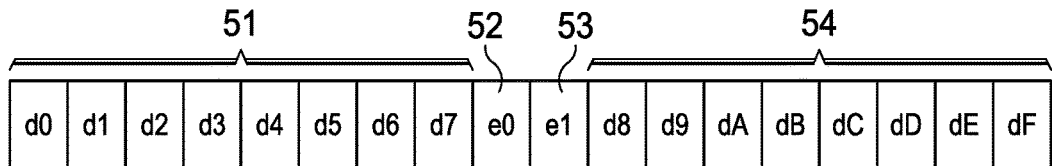
FIG. 6 illustrates an exemplary portion of the exemplary addressing pattern of FIG. 5.

FIG. 6 illustrates the relationship between data blocks 51 and 54 and ECC blocks 52 and 52 of FIG. 5 in more detail. Data block 51 has eight 64-byte bursts, d0-d7. Data block 54 has eight 64-byte bursts, d8-dF. 64-byte ECC block 52 contains ECC data e0 for data block 51 and 64-byte ECC block 53 contains ECC data e1 for data block 54. Using the address pattern of FIGS. 5 and 6, the first burst of blocks 51 and 54 will always be on a 128-byte boundary throughout memory. Thus, in this particular example, all read commands sent to the memory device should be 128-bit aligned, and all two-burst operations are always two-burst (in this case 128-byte) aligned.

Other alignment examples are contemplated by the present system. For example, a 256-byte alignment may be used with a 64-burst memory device. In such a case, four 64-byte ECC blocks would be placed between 16 blocks of data. This guarantees that all master requests that are 256-byte aligned are also 256-byte aligned to the memory device.

Figure 7:
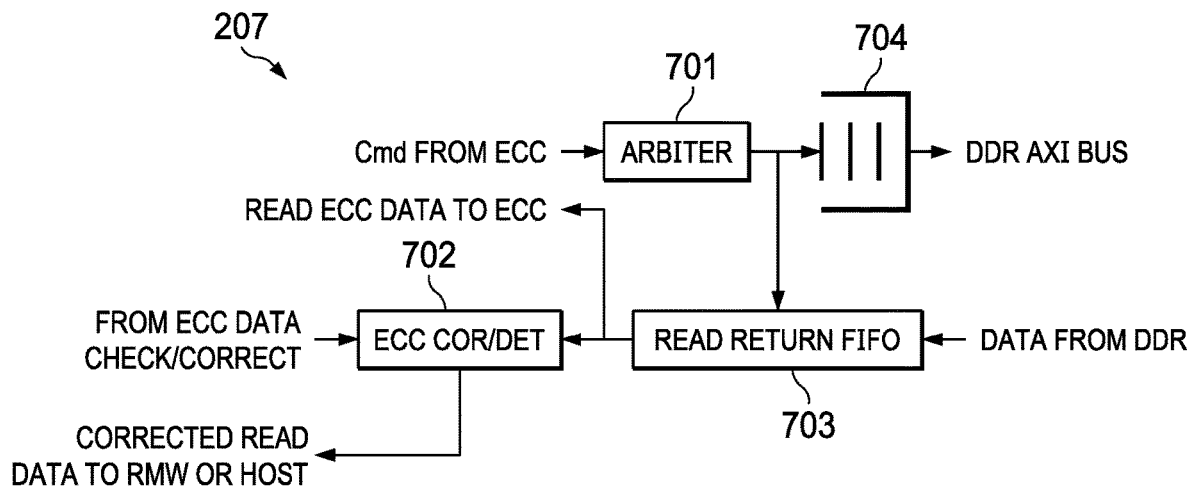
FIG. 7 illustrates a block diagram of an exemplary state machine (SM) block.

FIG. 7 shows a block diagram of state machine (SM) 207. Arbiter 701 is responsible for arbitrating commands to the memory controller 103 to ensure resources are available. Commands sent by the arbiter 701 to memory controller 103 may be sent through multi-threaded FIFO queue 704. When read return FIFO 703 receives data and ECC from the memory device (e.g., memory device 106 of FIG. 1) in response to a read command, read return FIFOs hold the data and ownership for that data, and returns the ECC data to the in-line ECC 206. Read Return FIFO 703 sends data to ECC correction and detection (ECC COR/DET) block 702, which, in the case of a SECDED device, single-error corrects and/or double-error detects ECC protected regions of memory using the ECC data received from the in-line ECC block 206, and returns the corrected read data to the RMW block 205 for merger. ECC correction and detection block 702 performs this ECC check over the entire burst of data received from the memory device. Because eight ECC blocks are checked per burst, and because the ECC syndromes also contain a memory address, the probability of a false hit on an ECC syndrome in the event of an address bit error is small. Read Return FIFO 703 may return read ECC data directly to in-line ECC 206.

Examples of ECC caching described herein (e.g., of ECC cache buffers 402) provide efficient merging and caching of transactions to avoid less than optimal bursts on the memory device interface. Disclosed embodiments check and calculate ECC across an entire burst, regardless of the data requested, to provide further protection for commands and addresses. Checking the ECC across an entire data burst access (e.g., the entire 64-byte data burst for DDR memory) protects against command or addressing faults. Disclosed examples may additionally encode the address of the transaction into the ECC syndrome, further protecting the transaction without additional bits, by a novel scheme of spreading the address across the burst. Disclosed examples further protect the functions (e.g., address translation, ECC generation, etc.) with additional diagnostic measures such as parity in order to enable higher error detection ratings. The disclosed invention can further be extended by adding obfuscation or encryption to protect the data and enhance error detection.

The solution described in this disclosure is advantageous over existing solutions because it provides a more efficient use of the address space (potentially eliminating wasted memory), provides superior protection against address faults (row, column, bank and rank) by use of a novel address translation scheme, provides more efficient use of the memory interface by minimizing RMW and sub-burst accesses, provides protection for the entire memory controller by generating the two independent commands before they enter the memory command queue, and encoding the address into the ECC syndrome provides additional protection.

The in-line ECC protection techniques described herein may be implemented in any type of electronic system or device and is particularly useful for systems and devices in applications where functional safety is critical, such as automotive (e.g., ADAS or Advanced driver assistance systems) or industrial applications. An example of such a device may include various internal and/or external components contributing to the function of the device, which can include hardware elements (including circuitry), software elements (including computer code stored on a tangible computer-readable medium) or a combination of both hardware and software elements. The device can include input/output (I/O) ports, input structures, one or more processors, memory, power source, etc.

Figure 8:
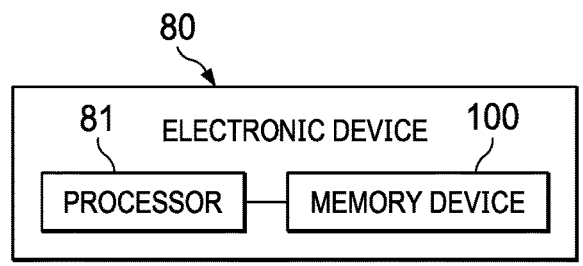
FIG. 8 illustrates an exemplary device including the exemplary memory system described herein.

FIG. 8 shows one such exemplary device 80, having exemplary processor 81 and memory device 100 according to the examples described herein.

The processor 81 may control the general operation of the device 80. For instance, the processor 81 may provide the processing capability to execute an operating system, programs, user and application interfaces, and any other functions of the device. The processor 81 may include one or more microprocessors, such as one or more general-purpose microprocessors, application-specific microprocessors (ASICs), or a combination of such processing components. The processor 81 may include one or more processors based upon x86 or RISC architectures, as well as dedicated graphics processors (GPU), image signal processors, digital signal processors, video processors, audio processors and/or related chip sets. The processor 81 may include a number of same or different types of processing cores and may be implemented as a system on a chip (SOC) device.

Instructions or data to be processed by the processor 81 may be stored in a computer-readable medium, such as the memory device 100. The memory device 100 may include a memory device (e.g., DRAM, SDRAM or internal memory) and an ECC bridge that implements the above-described in-line ECC functions.

While the ECC functionality and address translation is described herein as occurring in the ECC bridge 102, this functionality may instead be implemented, in whole or in part, in another component (e.g., memory controller 103).

Modifications are possible in the described embodiments, and other embodiments are possible, within the scope of the claims.

What is claimed is:

1. A device comprising:
a memory configured to store data according to an address space; and
a circuit coupled to the memory and configured to:
receive a first write command associated with a first set of data;
generate a first set of error correction code (ECC) data for the first set of data;
receive a second write command associated with a second set of data;
generate second set of ECC data for the second set of data;
cause the first set of data to be stored in the memory;
cause the second set of data to be stored, in the memory, adjacent to the first set of data in the address space;
cause the first set of ECC data to be stored, in the memory, adjacent to and prior to the first set of data in the address space; and
cause the second set of ECC data to be stored, in the memory, adjacent to and after the second set of data in the address space.

2. The device of claim 1, wherein the circuit is configured to:
receive a third write command associated with a third set of data;
generate third set of ECC data for the third set of data;
cause the third set of ECC data to be stored, in the memory, adjacent to the second set of ECC data in the address space; and
cause the third set of data to be stored, in the memory, adjacent to and after the third set of ECC data in the address space.

3. The device of claim 1, wherein:
the first write command is a read-modify-write command that specifies a third set of data; and
the circuit includes a read-modify-write circuit configured to, based on the read-modify-write command:
read a fourth set of data from the memory; and
merge the third set of data with the fourth set of data to produce the first set of data.

4. The device of claim 1, wherein the memory is a random-access memory.

5. The device of claim 1, wherein the first set of ECC data is Single-Error-Correct-Double-Error-Detect (SECDED) data.

6. The device of claim 1, wherein the first set of ECC data encodes at least one of: an address of the first set of data or an address of the first set of ECC data.

7. The device of claim 1, wherein:
the first set of data has a size of 512 bytes; and
the first set of ECC data has a size of 512 bytes.

8. A device comprising:
a memory configured to store data according to an address space;
a processor configured to provide a first write command to write a first set of data and a second write command to write a second set of data; and
a memory control circuit coupled between the memory and the processor and configured to:
receive the first write command and the second write command; and
cause the first set of data, a first set of error correction code (ECC) data associated with the first set of data, the second set of data, and a second set of ECC data associated with the second set of data to be stored in the memory such that:
the first set of data is adjacent to the second set of data in the address space;
the first set of ECC data is adjacent to and prior to the first set of data in the address space; and
the second set of ECC data is adjacent to and after the second set of data in the address space.

9. The device of claim 8, wherein the memory control circuit includes an ECC calculation circuit configured to generate the first set of ECC data and the second set of ECC data.

10. The device of claim 8, wherein:
the processor is configured to provide a third write command to write a third set of data; and
the memory control circuit is configured to cause the third set of data and a third set of ECC data associated with the third set of data to be stored in the memory such that:
the third set of ECC data is adjacent to the second set of ECC data in the address space; and
the third set of data is adjacent to and after the third set of ECC data in the address space.

11. The device of claim 8, wherein the memory is a random-access memory.

12. The device of claim 8, wherein the first set of ECC data is Single-Error-Correct-Double-Error-Detect (SECDED) data.

13. The device of claim 8, wherein the first set of ECC data encodes at least one of: an address of the first set of data or an address of the first set of ECC data.

14. The device of claim 8, wherein:
the first set of data has a size of 512 bytes; and
the first set of ECC data has a size of 512 bytes.

15. A method comprising:
receiving a first set of data;
generating a first set of error correction code (ECC) data based on the first set of data;
receiving a second set of data;
generating a second set of ECC data based on the second set of data;
storing the first set of data, the first set of ECC data, the second set of data, and a second set of ECC data in a memory such that:
the first set of data is adjacent to the second set of data in an address space;
the first set of ECC data is adjacent to and prior to the first set of data in the address space; and
the second set of ECC data is adjacent to and after the second set of data in the address space.

16. The method of claim 15, wherein the receiving of the first set of data include:
receiving a read-modify-write command that specifies a third set of data; and
based on the read-modify-write command:
reading a fourth set of data from the memory; and
merging the third set of data with the fourth set of data to produce the first set of data.

17. The method of claim 15, wherein the memory is a random-access memory.

18. The method of claim 15, wherein the first set of ECC data is Single-Error-Correct-Double-Error-Detect (SECDED) data.

19. The method of claim 15, wherein the first set of ECC data encodes at least one of: an address of the first set of data or an address of the first set of ECC data.

20. The method of claim 15, wherein:
the first set of data has a size of 512 bytes; and
the first set of ECC data has a size of 64 bytes.

* * * * *